United States Patent
Sze et al.

(10) Patent No.: US 8,068,043 B2
(45) Date of Patent: Nov. 29, 2011

(54) METHOD AND APPARATUS FOR VIDEO PROCESSING IN CONTEXT-ADAPTIVE BINARY ARITHMETIC CODING

(75) Inventors: Vivienne Sze, Toronto (CA); Madhukar Budagavi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/580,876

(22) Filed: Oct. 16, 2009

(65) Prior Publication Data

US 2010/0097248 A1   Apr. 22, 2010

Related U.S. Application Data

(60) Provisional application No. 61/106,323, filed on Oct. 17, 2008.

(51) Int. Cl.
*H03M 7/40* (2006.01)
(52) U.S. Cl. .......................... 341/67; 341/107
(58) Field of Classification Search ............... 341/107, 341/67; 382/232; 375/240.03
See application file for complete search history.

(56) References Cited

U.S. PATENT DOCUMENTS

| 6,363,119 | B1* | 3/2002 | Oami | 375/240.03 |
| 7,088,271 | B2* | 8/2006 | Marpe et al. | 341/107 |
| 2005/0146451 | A1* | 7/2005 | Kobayashi et al. | 341/107 |
| 2006/0104351 | A1* | 5/2006 | Teng | 375/240.03 |
| 2006/0104521 | A1* | 5/2006 | Teng | 382/232 |
| 2007/0279266 | A1* | 12/2007 | Chen et al. | 341/67 |

OTHER PUBLICATIONS

Marpe, Schwarz and Wiegand, "Context-Based Adaptive Binary Arithmetic Coding in the H.264/AVC Video Compression Standard", IEEE Trans. Circuits Systems for Video Technology, vol. 13, No. 7, Jul. 2003.

* cited by examiner

*Primary Examiner* — Jean Jeanglaude
(74) *Attorney, Agent, or Firm* — Mirna Abyad; Wade J. Brady, III; Frederick J. Telecky, Jr.

(57) ABSTRACT

A method and apparatus of a digital signal processor for coding of a significant map. The method for coding of a significant map includes carrying out a scan of at least a portion of a block of transform coefficients; calculating runs of zeros of the scanned data; and coding runs of zeros with variable length coding.

12 Claims, 1 Drawing Sheet

METHOD AND APPARATUS FOR VIDEO PROCESSING IN CONTEXT-ADAPTIVE BINARY ARITHMETIC CODING

CROSS-REFERENCE TO RELATED APPLICATIONS

This application claims benefit of U.S. provisional patent application Ser. No. 61/106,323, filed Oct. 17, 2008, which is herein incorporated by reference.

BACKGROUND OF THE INVENTION

1. Field of the Invention

Embodiments of the present invention generally relate to a method and apparatus for video processing in Context-Adaptive Binary Arithmetic Coding (CABAC).

2. Description of the Related Art

Context-Adaptive Binary Arithmetic Coding (CABAC) is one of two entropy engines used by the existing video coding standard H.264. Its purpose is to provide further compression of the video bit-stream.

The existing CABAC engine for the H.246 standard has limited throughput due to its binarization scheme which generates a large number of bins that need to be encoded, and the fact that its arithmetic coding engine is limited to encoding a single bin per cycle. Consequently, in order to meet performance requirements of HD video bit-streams, the CABAC engine needs to run at extremely high frequencies which consumes a significant amount of power and in some cases may not be feasible.

Thus, there is a need for a CABAC engine that is capable of processing adaptive binary arithmetic coding more efficiently.

SUMMARY OF THE INVENTION

Embodiments of the present invention relate to a method and apparatus for coding of a significant map in accordance with the present invention. The method include carrying out a scan of at least a portion of a block of transform coefficients, calculating runs of zeros of the scanned data; and coding runs of zeros with variable length coding.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

H.264 defines slice structures to create independently decodable data units. The dependency of context models and parsing process inside a slice structure makes it impossible do multiple processor CABAC decoding below the slice layer. Usually, the maximum allowable slice size is equal to a picture in the H.264 standard. Therefore hardware H.264 CABAC decoders that rely on slice level parallelism should work on picture-level to handle this worst case scenario. Operating picture level introduces extra decoding delay and increases the memory bandwidth requirements.

In the H.264 CABAC, the significance map information, namely the "significant_coeff_flag" and "last_coeff_flag" syntax elements, result in the majority of the bins that need to be encoded. Specifically, the significance map information dominates the total number of bin making up ~47% for QP=22, and 30% for QP=27. The significance map involves using 0 and 1 to represent the location of non-zero coefficients. The non-zero coefficients levels are then encoded separately.

The same information may be represented using run-length encoding, where a run of zeros is represented by a run number followed by a number representing the non-zero coefficient level. The run numbers may be translated to bins with a first order Exp-Golomb binarization scheme.

Figure 1:
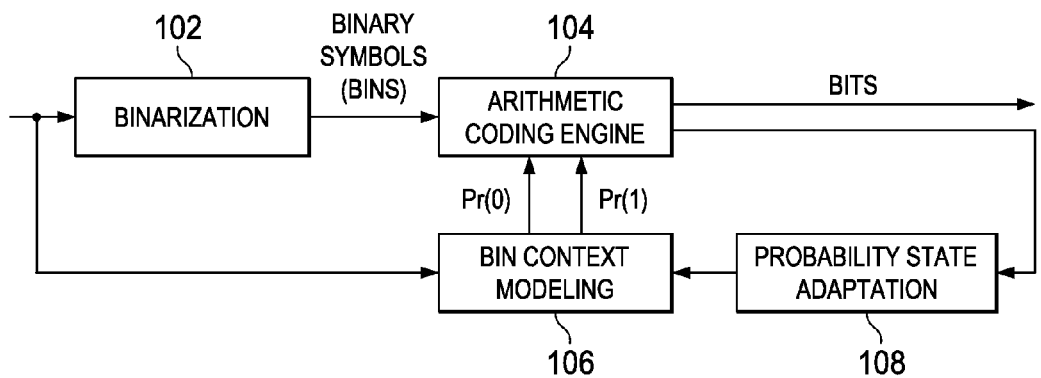
FIG. 1 is an embodiment of a block diagram for a context-adaptive binary coding arithmetic coding system.

FIG. 1 is an embodiment of a block diagram for a context-adaptive binary coding arithmetic coding system 100. The system 100 includes binarization 102, arithmetic coding engine 104, bin context modeling 106 and probability state adaptation 108.

For instance, given a 8×8 block with the following coefficient values

| 8  | 4  | -2 | 1 | 0 | -1 | 0 | 0 |
|----|----|----|---|---|----|---|---|
| 6  | 4  | -1 | 0 | 0 | 0  | 0 | 0 |
| 1  | 1  | 0  | 0 | 0 | 0  | 0 | 0 |
| -3 | 0  | 2  | 0 | 0 | 0  | 0 | 0 |
| -3 | -1 | 2  | 0 | 0 | 0  | 0 | 0 |
| -1 | -1 | 0  | 0 | 0 | 0  | 0 | 0 |
| 0  | 0  | 0  | 0 | 0 | 0  | 0 | 0 |
| 0  | 0  | 0  | 0 | 0 | 0  | 0 | 0 |

A significance map would result in the following bins significant_coeff_flag:

1, 1, 1, 1, 1, 1, 1, 1, 1, 1, 1, 0, 0, 0, 0, 1, 0, 0, 1, 1, 1, 0, 1, 1 last_significant_coeff_flag:

0, 0, 0, 0, 0, 0, 0, 0, 0, 0, 0, 0, 0, 0, 0, 1

The total run of bins would be 1, 0, 1, 0, 1, 0, 1, 0, 1, 0, 1, 0, 1, 0, 1, 0, 1, 0, 1, 0, 1, 0, 0, 0, 0, 0, 1, 0, 0, 0, 1, 0, 1, 0, 1, 0, 0, 1, 0, 1, 1 (41-bins)

The run length approach would give the following values 0, 0, 0, 0, 0, 0, 0, 0, 0, 0, 0, 4, 2, 0, 0, 1, 0, end_of_block"

which when binarized would be 0, 0, 0, 0, 0, 0, 0, 0, 0, 0, 0, 00110, 011, 0, 0, 010, 0, 00101 (30-bins)

By using run-length encoding (in conjunction with a binarization scheme e.g. Exp-Golomb), rather than the current significance map approach, the number bins required to represent this information is reduced leading to a reduction in the number of compute cycles required for coding the bins which in turn leads to a corresponding increase in throughput. For example, in the case of Exp-Golomb the number of bins required to represent the position of non-zero coefficients in an 8×8 block are reduced by an estimated average of ~30% (or ~15% of the total number of bins for the average 720 p bit-stream).

The approach can be extended to run-length coding the entire macroblock (16×16) and a 64×64 macroblock which is being proposed for the next generation standard.

Using run-length across a large block can lead to better compression and consequently fewer bins. The bins of the run-length may be encoded with either a fixed or adaptive context (e.g. context assignment similar to coefficient level). (See additional figure "CABAC coding of runs" in attached slides).

The example binarization is given below:

| Code word | Information signaled |
|---|---|
| 0 | Run of zero |
| 100 | End of block |
| 101 | Run of one |
| 11000 | Run of two |
| 11001 | Run of three |
| 11010 | Run of four |
| ... | ... |

Other forms of binarization, such as, truncated unary or concatenation of truncated unary with Exp-golomb, may be used.

Figure 2:
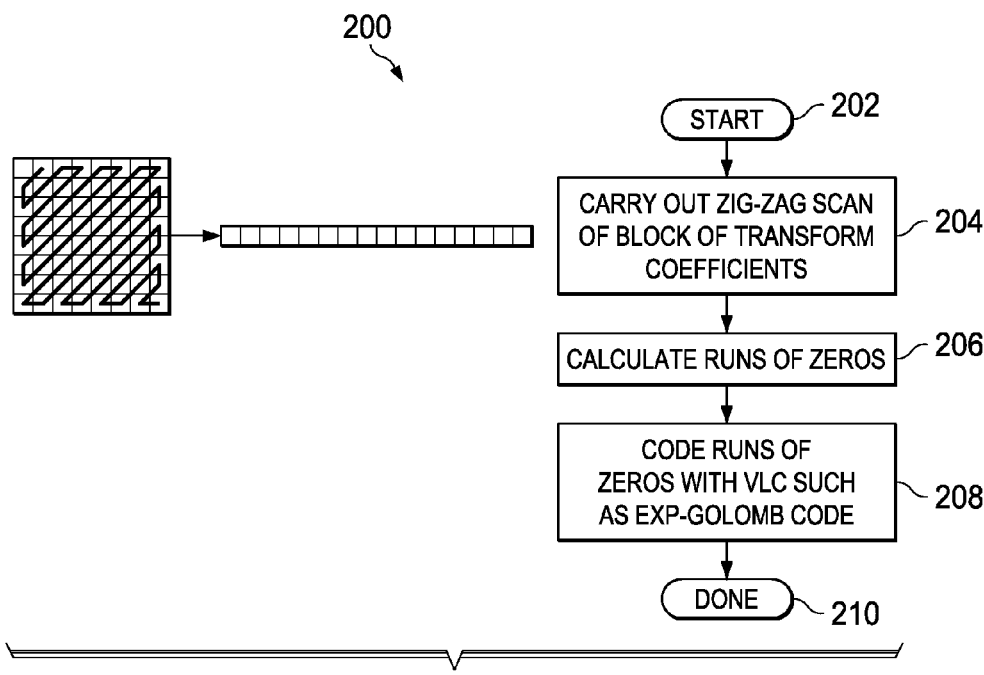
FIG. 2 is an embodiment of a method for coding of a significant map in accordance with the present invention.

FIG. 2 is an embodiment of a method for coding of a significant map in accordance with the present invention. The method 200 starts at step 202. At step 204, the method 200 carries out a zig-zag scan of block of transform coefficients. At step 206, the method 200 calculates runs of zeros. At step 208, the method codes runs of zeros with variable length coding, such as, Exp-Golomb code, Unary, Huffman coding, and the likes.

While the foregoing is directed to embodiments of the present invention, other and further embodiments of the invention may be devised without departing from the basic scope thereof, and the scope thereof is determined by the claims that follow.

What is claimed is:

1. A method of a digital signal processor for coding of a significant map, comprising:
   carrying out a scan of at least a portion of a block of transform coefficients;
   calculating runs of zeros of the scanned data; and
   coding runs of zeros with variable length coding; wherein the variable length coding is at least one of Exp-Golomb code, Unary, Huffman coding.

2. The method of claim 1, wherein the scan is a zig-zag scan.

3. The method of claim 1, wherein the scan at least one of a single block of transform coefficients or across multiple blocks of transform coefficients within a macroblock.

4. The method of claim 1, wherein the binarized run is further compressed by using context adaptive binary arithmetic coding.

5. An apparatus for coding of a significant, comprising:
   means for carrying out a scan of at least a portion of a block of transform coefficients;
   means for calculating runs of zeros of the scanned data; and
   means for coding runs of zeros with variable length coding; wherein the variable length coding is at least one of Exp-Golomb code, Unary, Huffman coding.

6. The apparatus of claim 5, wherein the scan at least one of a single block of transform coefficients or across multiple blocks of transform coefficients within a macroblock.

7. The apparatus of claim 5, wherein the scan is a zig-zag scan.

8. The apparatus of claim 5, wherein the binarized run is further compressed by using context adaptive binary arithmetic coding.

9. A computer readable medium comprising code, when executed, performs a method for coding of a significant, comprising:
   carrying out a scan of at least a portion of a block of transform coefficients;
   calculating runs of zeros of the scanned data; and
   coding runs of zeros with variable length coding; wherein the variable length coding is at least one of Exp-Golomb code, Unary, Huffman coding.

10. The computer readable medium of claim 9, wherein the scan is a zig-zag scan.

11. The computer readable medium of claim 9, wherein the binarized run is further compressed by using context adaptive binary arithmetic coding.

12. The computer readable medium of claim 9, wherein the scan at least one of a single block of transform coefficients or across multiple blocks of transform coefficients within a macroblock.

* * * * *

UNITED STATES PATENT AND TRADEMARK OFFICE
CERTIFICATE OF CORRECTION

| | | |
|---|---|---|
| PATENT NO. | : 8,068,043 B2 | Page 1 of 1 |
| APPLICATION NO. | : 12/580876 | |
| DATED | : November 29, 2011 | |
| INVENTOR(S) | : Vivienne Sze and Madhukar Budagavi | |

It is certified that error appears in the above-identified patent and that said Letters Patent is hereby corrected as shown below:

Claims 6 and 11 should be corrected to add the word "map" in line 1 and line 2, respectively:

Col. 4, Claim 6
6. An apparatus for coding of a significant <u>map,</u> comprising:
   means for carrying out a scan of at least a portion of a block of transform coefficients;
   means for calculating runs of zeros of the scanned data; and
   means for coding runs of zeros with variable length coding; wherein the variable length coding is at least one of Exp-Golomb code, Unary, Huffman coding.

Col. 4, claim 11
11. A computer readable medium comprising code, when executed, performs a method for coding of a significant <u>map</u> comprising:
   carrying out a scan of at least a portion of a block of transform coefficients;
   calculating runs of zeros of the scanned data; and
   coding runs of zeros with variable length coding; wherein the variable length coding is at least one of Exp-Golomb code, Unary, Huffman coding.

Signed and Sealed this
Tenth Day of January, 2012

David J. Kappos
*Director of the United States Patent and Trademark Office*

UNITED STATES PATENT AND TRADEMARK OFFICE
CERTIFICATE OF CORRECTION

PATENT NO. : 8,068,043 B2
APPLICATION NO. : 12/580876
DATED : November 29, 2011
INVENTOR(S) : Vivienne Sze and Madhukar Budagavi It is certified that error appears in the above-identified patent and that said Letters Patent is hereby corrected as shown below:

Col. 4, lines 16-18 Claim 6 should read
-- 6. An apparatus for coding of a significant map, comprising:
 means for carrying out a scan of at least a portion of a block of transform coefficients;
 means for calculating runs of zeros of the scanned data; and
 means for coding runs of zeros with variable length coding; wherein the variable length coding is
at least one of Exp-Golomb code, Unary, Huffman coding. --

Col. 4, Lines 35-57 Claim 11 should read
-- 11. A computer readable medium comprising code, when executed, performs a method for coding
 of a significant map comprising:
 carrying out a scan of at least a portion of a block of transform coefficients;
 calculating runs of zeros of the scanned data; and
 coding runs of zeros with variable length coding; wherein the variable length coding is at least
one of Exp-Golomb code, Unary, Huffman coding. --

This certificate supersedes the Certificate of Correction issued January 10, 2012.

Signed and Sealed this
Fourteenth Day of February, 2012

David J. Kappos
*Director of the United States Patent and Trademark Office*